(12) United States Patent
Andrianoelison et al.

(10) Patent No.: US 10,319,822 B2
(45) Date of Patent: Jun. 11, 2019

(54) CONTROLLING METHOD OF A TRANSISTOR OF TYPE IGBT AND ASSOCIATED CONTROLLING DEVICE

(71) Applicant: ALSTOM Transport Technologies, Saint-Ouen (FR)

(72) Inventors: Florent Andrianoelison, Aureilhan (FR); Eric Rabasse, Horgues (FR); Stephane Boisteau, Saint Benoit (FR)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 0 days.

(21) Appl. No.: 15/712,665

(22) Filed: Sep. 22, 2017

(65) Prior Publication Data
US 2018/0090578 A1 Mar. 29, 2018

(30) Foreign Application Priority Data

Sep. 23, 2016 (FR) ...................................... 16 58986

(51) Int. Cl.
| | | |
|---|---|---|
| H01L 29/417 | (2006.01) | |
| H01L 23/538 | (2006.01) | |
| H01L 29/739 | (2006.01) | |
| H03K 17/082 | (2006.01) | |
| H03K 17/16 | (2006.01) | |

(52) U.S. Cl.
CPC .... *H01L 29/41708* (2013.01); *H01L 23/5382* (2013.01); *H01L 29/7393* (2013.01); *H03K 17/0828* (2013.01); *H03K 17/166* (2013.01); *H03K 17/168* (2013.01)

(58) Field of Classification Search
CPC .......................... H01L 23/5382; H01L 29/4108
See application file for complete search history.

(56) References Cited

U.S. PATENT DOCUMENTS

| | | | |
|---|---|---|---|
| 2015/0127276 A1* | 5/2015 | Monokroussos | H02S 50/15 702/58 |
| 2015/0181675 A1* | 6/2015 | Lochmann | H05B 33/0815 315/291 |
| 2017/0039461 A1* | 2/2017 | Winteraeken | G05B 11/42 |

FOREIGN PATENT DOCUMENTS

WO WO-2014/009668 1/2014

OTHER PUBLICATIONS

Takizawa S et al: "A new di/dt control gate drive circuit for IGBTs to reduce EMI noise and switching losses", Power Electronics Specialists Conference,1998. PESC 98 Record. 29th Annual IEEE Fukuoka, Japan May 17-22, 1998, New York, NY, USA, IEEE, US, vol. 2, May 17, 1998 (May 17, 1998), pp. 1443-1449, XP010294730, DOI : 10. 1109/PESC. 1998. 703241 ISBN: 978-0-7803-4489-1 * Paragraphs 2 and 3.
Search Report for FR 1658986, dated May 10, 2017.

* cited by examiner

*Primary Examiner* — Wael M Fahmy
*Assistant Examiner* — Sarah K Salerno
(74) *Attorney, Agent, or Firm* — B. Aaron Schulman, Esq.; Stites & Harbison PLLC (57) ABSTRACT

This method for controlling an IGBT-type transistor includes a phase for switching the transistor between an on state and an off state. Said phase comprises generating a setpoint current whereof the intensity on the gate of the transistor assumes different setpoint values. At least some of the setpoint values are chosen as a function of the sign of the temporal derivative of the main current. Each setpoint value is chosen from a set of predetermined setpoint values.

10 Claims, 5 Drawing Sheets

CONTROLLING METHOD OF A TRANSISTOR OF TYPE IGBT AND ASSOCIATED CONTROLLING DEVICE

The present invention relates to a method for controlling an IGBT-type transistor and an associated control device.

In a manner known in itself, a transistor of the IGBT (Insulated Gate Bipolar Transistor) type comprises three electric terminals or contacts, i.e., a gate, a collector and an emitter.

An IGBT transistor is in particular usable as an electric switch. Indeed, such a transistor defines an on state, in which the collector is electrically connected to the emitter, and an off state, in which they are electrically isolated from one another.

The switching between the two states is controlled by a setpoint voltage applied on the gate by suitable control means.

In particular, the switching between the blocked state and the on state comprises a phase for switching to triggering consisting of switching the transistor from the off state to the on state, and a phase for switching to blocking consisting of switching the transistor from the on state to the off state.

Each of these phases comprises several intermediate steps corresponding to various intermediate states between the off state and the on state.

Generally, the control of the transistor is suitable for ensuring that these intermediate steps take place correctly and guaranteeing a constant switching speed.

To that end, the control means associated with the transistor apply different currents to the gate based on each intermediate step in progress.

It is therefore important to be able to detect each of the intermediate steps to ensure the control of a transistor.

According to methods known in the state of the art, the detection of the intermediate steps is done by measuring the voltage between the collector and the emitter, and the intensity of the electrical current passing through the collector.

However, in order to determine the transition moments between the intermediate steps precisely, it is necessary to provide the control means with voltage and intensity measurements of the current passing through the transistor particularly precisely.

One can then see that this makes the structure of the electrical circuit associated with the transistor more complex. This problem becomes particularly relevant for transistors used in the railway field, and then operating under high voltage.

The present invention aims to propose a method for controlling a transistor of the IGBT type allowing effective control of the intermediate steps when switching the transistor between the off state and the on state without making the structure of the electrical circuit associated with the transistor more complex.

To that end, the invention relates to a method for controlling a transistor of the IGBT type, the transistor comprising a gate, a collector and an emitter, and defining an on state in which a main current flows between the collector and the emitter and an off state in which the collector is electrically isolated from the emitter.

The method includes a phase for switching between the on state and the off state comprising generating a setpoint current, the intensity of which on the gate of the transistor assumes different setpoint values, at least some of the setpoint values being chosen as a function of the sign of the temporal derivative of the main current, each setpoint value being chosen from a set of predetermined setpoint values.

According to other advantageous aspects of the invention, the method comprises one or more of the following features, considered alone or according to all technically possible combinations:

- the switching phase further comprises measuring the voltage of the electrical current between the gate and the emitter and comparing this voltage with at least one predetermined voltage threshold;
- at least one setpoint value is chosen when said voltage between the gate and the emitter reaches the predetermined voltage threshold;
- at least one setpoint value is chosen as a function of the time elapsed from the moment when a previous setpoint value was chosen;
- the switching phase is a phase for switching to triggering consisting of switching the transistor from the off state to the on state or a phase for switching to blocking consisting of switching the transistor from the on state to the off state;
- the phase for switching to triggering comprises the following steps, carried out consecutively:
  - preliminary triggering step consisting of receiving an order to switch the transistor from the off state to the on state;
  - first switching step consisting of generating the setpoint current with an intensity equal to a first setpoint value until the voltage of the electrical current between the gate and the emitter reaches a predetermined triggering voltage threshold, or the temporal derivative of the main current becomes positive, or the time elapsed since the beginning of the first switching step reaches a first predetermined time threshold;
  - second switching step consisting of generating the setpoint current with an intensity equal to a second setpoint value until the temporal derivative of the main current becomes negative, or the time elapsed since the beginning of the second switching step reaches a second predetermined time threshold; and
  - third switching step consisting of generating the setpoint current with an intensity equal to a third setpoint value until the time elapsed since the beginning of the first switching step reaches a predetermined triggering time threshold;
- the phase for switching to blocking comprises the following steps, carried out consecutively:
  - preliminary blocking step consisting of receiving an order to switch the transistor from the on state to the off state;
  - fourth switching step consisting of generating the setpoint current with an intensity equal to a fourth setpoint value until the voltage of the electrical current between the gate and the emitter reaches a predetermined blocking voltage threshold, or the temporal derivative of the main current becomes negative, or the time elapsed since the beginning of the fourth switching step reaches a fourth predetermined time threshold;
  - fifth switching step consisting of generating the setpoint current with an intensity equal to a fifth setpoint value until the time elapsed since the beginning of the fifth switching step reaches a fifth predetermined time threshold; and
  - sixth switching step consisting of generating the setpoint current with an intensity equal to a sixth setpoint value until the time elapsed since the beginning of the fourth switching step reaches a predetermined blocking time threshold;

the phase for switching to triggering further comprises a step for detecting a short-circuit comprising the detection of a short-circuit as a function of the sign of the temporal derivative of the main current in an observation time window having a predetermined length;

the method includes at least two phases for switching between the on state and the off state, which are the phase for switching to triggering and the phase for switching to blocking.

The invention also relates to a device for controlling a transistor of the IGBT type, the transistor comprising a gate, a collector and an emitter, and defining an on state in which a main current flows between the collector and the emitter and an off state in which the collector is electrically isolated from the emitter.

The device is able to generate a setpoint current, the intensity of which on the gate of the transistor assumes different setpoint values, at least some of the setpoint values being chosen as a function of the sign of the temporal derivative of the main current, each setpoint value being chosen from a set of predetermined setpoint values.

These features and advantages of the invention will appear upon reading the following description, provided solely as a non-limiting example, and done in reference to the appended drawings, in which.

Figure 1:
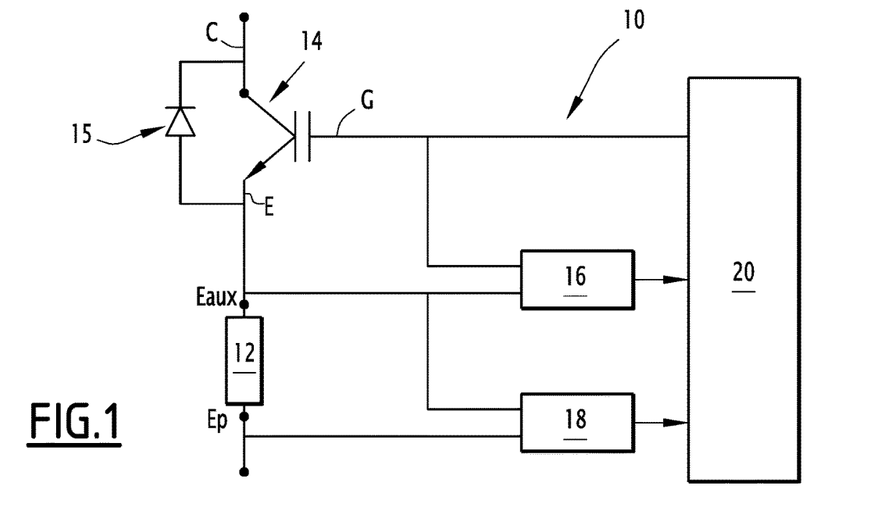
FIG. 1 is a schematic view of an electrical network in particular incorporating a transistor of the IGBT type and a device for controlling this transistor according to the invention.

The electrical network 10 of FIG. 1 can be used to at least partially control the operation of a power component 12 in particular comprising two terminals $E_{aux}$ and $E_p$.

The electrical network 10 and the power component 12 can in particular be used in the railway field, and are for example on board a railway vehicle.

In reference to FIG. 1, the electrical network 10 comprises a transistor 14 connected to the power component 12 and associated with a diode 15, a voltage measuring module 16, a current change detection module 18 and a control device 20 of the transistor 14 according to the invention.

The transistor 14 is a transistor of the IGBT (Insulated Gate Bipolar Transistor) type.

The transistor 14 is known in itself and in particular comprises three electrical terminals or contacts, namely a gate G, a collector C and an emitter E.

The emitter E is in particular connected to the terminal $E_{aux}$ of the power component 12.

The transistor 14 defines an on state in which electrical current $I_c$, hereinafter called main current, flows between the collector C and the emitter E and an off state in which the collector C is electrically isolated from the emitter E.

Furthermore, the diode 15 allows an electrical current to pass from the emitter E toward the collector C irrespective of the state of the transistor 14.

The voltage measuring module 16 is connected on the one hand to the gate G and on the other hand to the emitter E of the transistor 14 and makes it possible to measure a voltage $V_{GE}$ between the gate G and the emitter E.

The voltage measuring module 16 for example has a suitable voltmeter.

The current change measuring module 18 is connected to the terminals $E_{aux}$ and $E_p$ of the power component 12 and therefore makes it possible to detect any change in the intensity of the main current $I_c$ passing through the electrical component 12.

In other words, the module 18 makes it possible to detect any increase or decrease in the intensity values of the main current $I_c$ over time.

Also in other words, the module 18 makes it possible to detect the sign of the temporal derivative $dI_c/dt$ of the main current $I_c$.

To that end, the module 18 is able to measure the voltage U across the terminals $E_{aux}$ and $E_p$ of the power component 12. The sign of the temporal derivative $dI_c/dt$ of the main current $I_c$ is determined by the sign of the voltage U because the temporal derivative $dI_c/dt$ and the voltage U are linearly dependent. Indeed, the voltage U is equal to the product of the temporal derivative $dI_c/dt$ and the inductance of the power component 12.

The control device 20 is connected to the gate G of the transistor 14 and makes it possible to control the operation of this transistor 14 by applying a setpoint voltage and a setpoint current on the gate G using a control method 100 described in more detail below.

The control device 20 is further connected to the modules 16 and 18 to recover measurements of the voltage $V_{GE}$ and the sign of $dI_c/dt$, respectively, and to a power source (not shown) providing a positive setpoint voltage and negative setpoint voltage.

The positive setpoint voltage is for example substantially equal to +15 V.

The negative setpoint voltage is for example substantially equal to −15 V.

The control device 20 for example comprises a control circuit and a computer connected to the control circuit and allowing digital processing of the measurements from the modules 16 and 18 to carry out at least some of the steps of the control method 100.

Lastly, the control device 20 is able to receive a triggering order and a blocking order of the transistor 14, for example from a central computer (not shown).

The method for controlling 100 the transistor 14 will now be explained in detail.

The control method 100 comprises a phase for switching to triggering, a triggering phase, a phase for switching to blocking, and a blocking phase.

During the triggering phase, the control device 20 keeps the transistor 14 in the on state by applying the positive setpoint voltage on the gate G.

During the blocking phase, the control device 20 keeps the transistor 14 in the off state by applying the negative setpoint voltage on the gate G.

The phase for switching to triggering is a transitional phase between the blocking phase and the triggering phase and in particular makes it possible to switch the transistor 14 from the off state to the on state.

Figure 2:
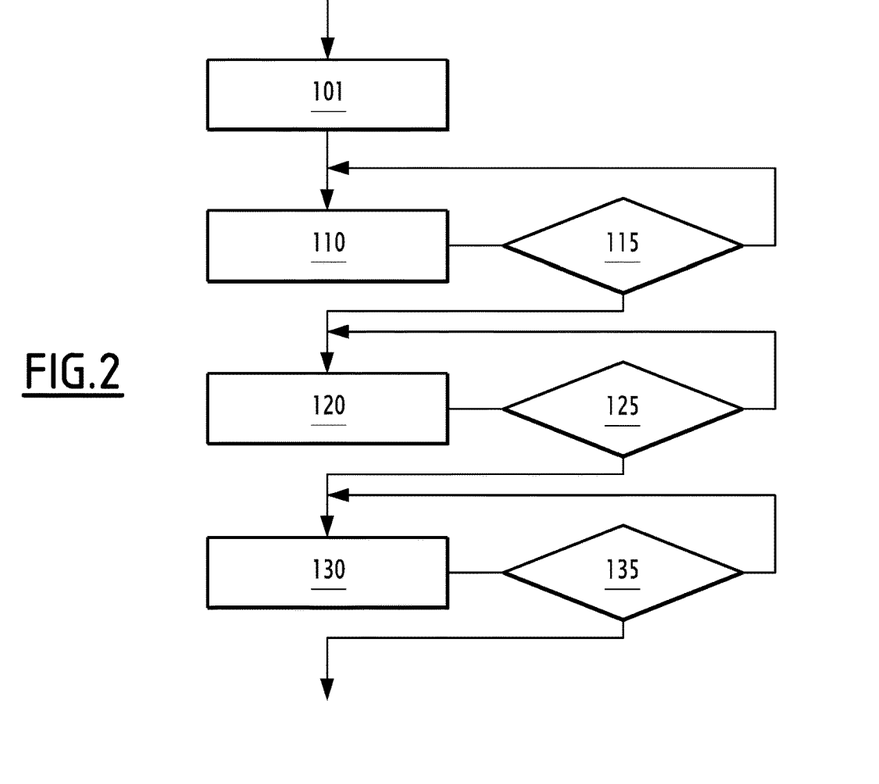
FIG. 2 is a flowchart of a phase for switching to triggering of a control method according to the invention implemented by the control device of FIG. 1.

A flowchart of this phase for switching to triggering is illustrated in FIG. 2.

Thus, in reference to this FIG. 2, the phase for switching to triggering comprises an initial step 101 during which the control device 20 receives a triggering order.

In this case, the control device 20 carries out steps 110 to 135.

During a first switching phase 110, the control device 20 applies, to the gate G of the transistor 14, the positive setpoint voltage with a setpoint current having an intensity equal to a first setpoint value $I_{c1}$.

During a step 115 carried out in parallel with the first switching step 110, the control device 20 receives measurements from the modules 16 and 18 and, using these measurements, verifies the stop conditions for the first switching step 110.

In particular, during this step 115, the control device 20 continues to carry out step 110 until one of the following stop conditions is met:

the voltage of the electrical current between the gate and the emitter $V_{GE}$ reaches a predetermined triggering voltage threshold $V_{ON}$;

the temporal derivative $dI_c/dt$ of the main current $I_c$ becomes positive;

the time elapsed since the beginning of the first switching step 110 reaches a first predetermined time threshold $T_1$.

The triggering voltage threshold $V_{ON}$ is configurable by the control device 20 and adjustable prior to carrying out the method 100, for example between 1 V and 20 V. This threshold $V_{ON}$ is preferably equal to 5 V.

The first time threshold $T_1$ is configurable by the control device 20 and adjustable prior to carrying out the method 100, for example between 1 µs and 8 µs.

The first setpoint value $I_{c1}$ is configurable by the control device 20 and adjustable prior to carrying out the method 100, for example between 0.2 A and 20 A.

Then, the control device 20 carries out a second switching step 120, during which it applies, to the gate G of the transistor 14, the positive setpoint voltage with a setpoint current having an intensity equal to a second setpoint value $I_{c2}$.

During a step 125 carried out in parallel with the second switching step 120, the control device 20 receives measurements from the module 18 and, using these measurements, verifies the stop conditions for the second step 120.

In particular, during this step 125, the control device 20 continues to carry out step 120 until one of the following stop conditions is met:

the temporal derivative $dI_c/dt$ of the main current $I_c$ becomes negative;

the time elapsed since the beginning of the second switching step 120 reaches a second predetermined time threshold $T_2$.

The second time threshold $T_2$ is configurable by the control device 20 and adjustable prior to carrying out the method 100, for example between 1 µs and 4 µs.

The second setpoint value $I_{c2}$ is configurable by the control device 20 and adjustable prior to carrying out the method 100, for example between 0.2 A and 20 A.

Then, the control device 20 carries out a third switching step 130, during which it applies, to the gate G of the transistor 14, the positive setpoint voltage with a setpoint current having an intensity equal to a third setpoint value $I_{c3}$.

During a step 135 carried out in parallel with the second switching step 130, the control device 20 verifies a stop condition for the third switching step 130.

In particular, during this step 135, the control device 20 continues to carry out step 130 until the time elapsed since the beginning of the first switching step 110 reaches a predetermined triggering time threshold $T_{ON}$.

The triggering time threshold $T_{ON}$ is configurable by the control device 20 and adjustable prior to carrying out the method 100, for example between 3 µs and 20 µs.

The third setpoint value $I_{c3}$ is configurable by the control device 20 and adjustable prior to carrying out the method 100, for example between 0.2 A and 20 A.

One can then see that during the implementation of the phase for switching to triggering, each setpoint value $I_{c1}$ to $I_{c3}$ is chosen from a set of predetermined setpoint values. These values are predetermined before the implementation of the control method.

Furthermore, the setpoint values $I_{c1}$ to $I_{c3}$ are different from one another.

In the described example, the setpoint values $I_{c1}$ to $I_{c3}$ are positive, such that the third setpoint value $I_{c3}$ is smaller than the first setpoint value $I_{c1}$ and larger than the second setpoint value $I_{c2}$.

Figure 3:
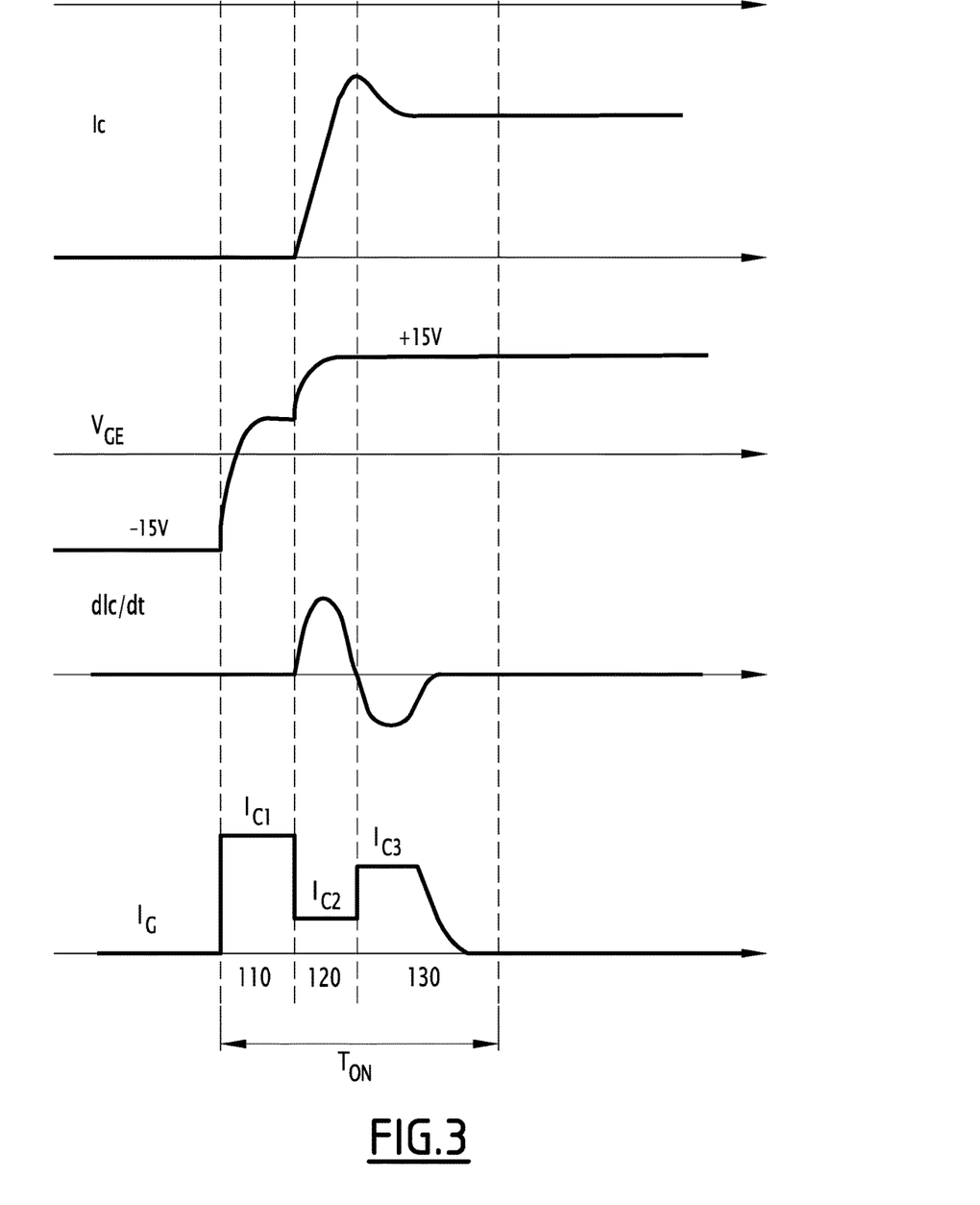
FIG. 3 is a schematic view illustrating different steps of the phase for switching to triggering of FIG. 2.

FIG. 3 illustrates the behavior of the main current $I_c$, the voltage $V_{GE}$ between the gate G and the emitter E, the temporal derivative $dI_c/dt$ of the main current $I_c$ and the setpoint current $I_G$ at the gate G in one example of the implementation of steps 110 to 130 of the phase for switching to triggering.

The phase for switching to blocking is a transitional phase between the triggering phase and the blocking phase and in particular makes it possible to switch the transistor 14 from the on state to the off state.

Figure 4:
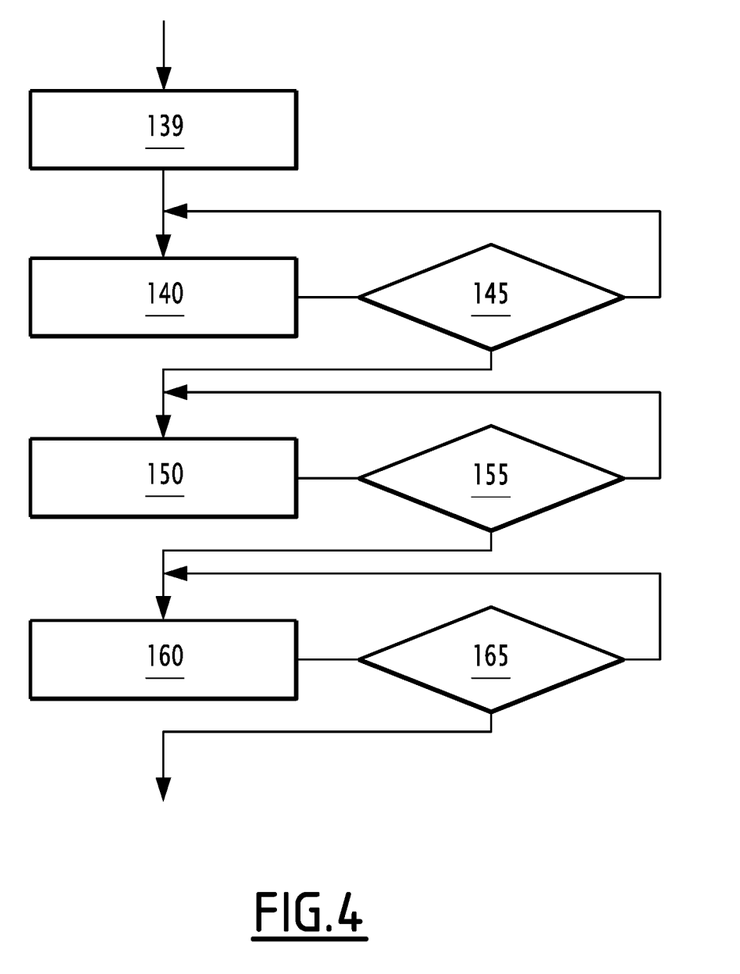
FIG. 4 is a flowchart of a phase for switching to blocking of the control method.

A flowchart of this phase for switching to blocking is illustrated in FIG. 4.

Thus, in reference to this FIG. 4, the phase for switching to blocking comprises an initial step 139 during which the control device 20 receives a blocking order.

In this case, the control device 20 carries out steps 140 to 165.

During a fourth switching phase 140, the control device 20 applies, to the gate G of the transistor 14, the negative setpoint voltage with a setpoint current having an intensity equal to a fourth setpoint value $I_{c4}$.

During a step 145 carried out in parallel with the fourth switching step 140, the control device 20 receives measurements from the modules 16 and 18 and, using these measurements, verifies the stop conditions for the fourth switching step 140.

In particular, during this step 145, the control device 20 continues to carry out step 140 until one of the following stop conditions is met:

the voltage of the electrical current $V_{GE}$ between the gate G and the emitter E reaches a predetermined block voltage threshold $V_{OFF}$;

the temporal derivative $dI_c/dt$ of the main current $I_c$ becomes negative;

the time elapsed since the beginning of the fourth switching step 140 reaches a fourth predetermined time threshold $T_4$.

The blocking voltage threshold $V_{OFF}$ is configurable by the control device 20 and adjustable prior to carrying out the method 100, for example between 0.5 V and 20 V. This threshold $V_{OFF}$ is preferably equal to 2 V.

The fourth time threshold $T_4$ is configurable by the control device 20 and adjustable prior to carrying out the method 100, for example between 1 µs and 10 µs.

The absolute value of the fourth setpoint value $I_{c4}$ is configurable by the control device 20 and adjustable prior to carrying out the method 100, for example between 0.2 A and 20 A.

Then, the control device 20 carries out a fifth switching step 150, during which it applies, to the gate G of the transistor 14, the negative setpoint voltage with a setpoint current having an intensity equal to a fifth setpoint value $I_{c5}$.

During a step 155 carried out in parallel with the fifth step 150, the control device 20 verifies a stop condition for the fifth switching step 150.

In particular, during this step 155, the control device 20 continues to carry out step 150 until the time elapsed since the beginning of the fifth switching step 150 reaches a predetermined fifth time threshold $T_5$.

The fifth time threshold $T_5$ is configurable by the control device 20 and adjustable prior to carrying out the method 100, for example between 0.5 µs and 2 µs.

The absolute value of the fifth setpoint value $I_{c5}$ is configurable by the control device 20 and adjustable prior to carrying out the method 100, for example between 0.2 A and 20 A.

Then, the control device 20 carries out a sixth switching step 160, during which it applies, to the gate G of the transistor 14, the negative setpoint voltage with a setpoint current having an intensity equal to a sixth setpoint value $I_{c6}$.

During a step 165 carried out in parallel with the sixth switching step 160, the control device 20 verifies a stop condition for the sixth switching step 160.

In particular, during this step 165, the control device 20 continues to carry out step 160 until the time elapsed since the beginning of the fourth switching step 140 reaches a predetermined blocking time threshold $T_{OFF}$.

The blocking time threshold $T_{OFF}$ is configurable by the control device 20 and adjustable prior to carrying out the method 100, for example between 3 µs and 20 µs.

The absolute value of the sixth setpoint value $I_{c6}$ is configurable by the control device 20 and adjustable prior to carrying out the method 100, for example between 0.2 A and 20 A.

One can then see that during the implementation of the phase for switching to blocking, each setpoint value $I_{c4}$ to $I_{c6}$ is chosen from a set of predetermined setpoint values. These values are predetermined before the implementation of the control method 100.

Furthermore, the setpoint values $I_{c4}$ to $I_{c6}$ are different from one another.

In the described example, the setpoint values $I_{c4}$ to $I_{c6}$ are negative, such that the sixth setpoint value $I_{c6}$ is smaller than the fifth setpoint value $I_{c5}$ and larger than the fourth setpoint value $I_{c4}$.

Figure 5:
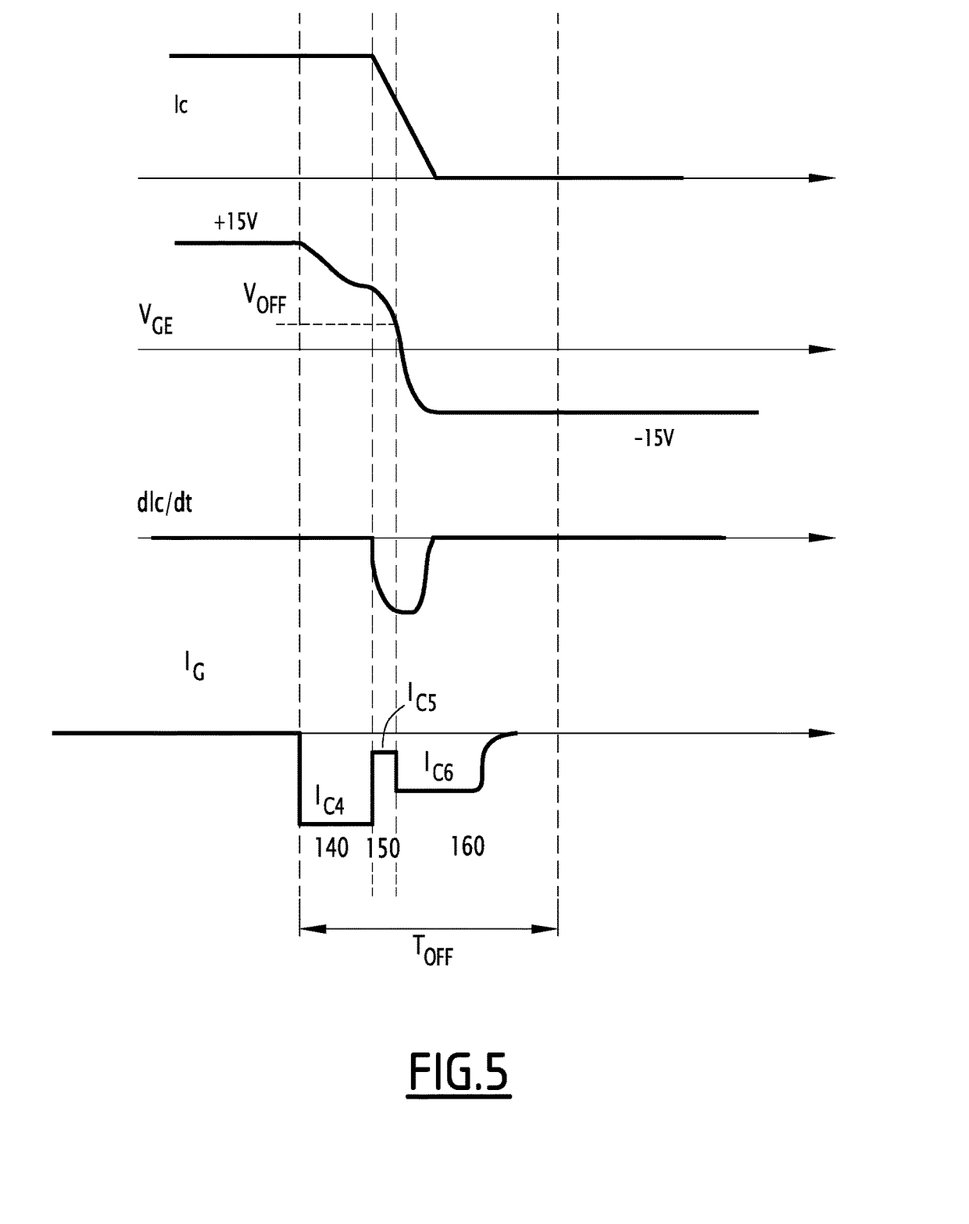
FIG. 5 is a schematic view illustrating different steps of the phase for switching to blocking of FIG. 4.

FIG. 5 illustrates the behavior of the main current $I_c$, the voltage $V_{GE}$ between the gate G and the emitter E, the temporal derivative $dI_c/dt$ of the main current $I_c$ and the setpoint current $I_G$ at the gate G in one example of the implementation of steps 140 to 160 of the phase for switching to blocking.

Additionally, the phase for switching to triggering comprises a step for detecting 170 a short-circuit in the electrical circuit 10. This step 170 is carried out in parallel with steps 110 to 135.

Figure 6:
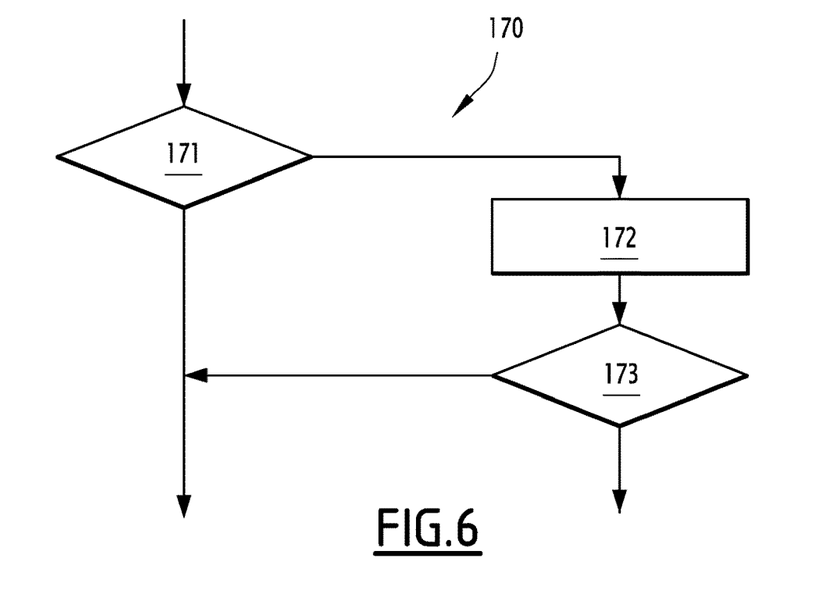
FIG. 6 is a flowchart of a step for detecting a short-circuit implemented during the phase for switching to triggering of FIG. 2.

In particular, this detection step 170 comprises several sub-steps, the flowchart of which is illustrated in FIG. 6.

During a sub-step 171, the control device 20 observes the sign of the temporal derivative $dI_c/dt$ of the main current $I_c$ in a temporal observation window $T_{obs}$.

The beginning of the temporal observation window $T_{obs}$ corresponds to the beginning of the phase for switching to triggering.

If the temporal derivative $dI_c/dt$ of the main current $I_c$ is positive during a predetermined test period $T_t$, the device 20 detects the presence of a short-circuit during a sub-step 172. If not, the control device 20 deduces that a short-circuit cannot occur.

Advantageously, step 170 further comprises a sub-step 173 during which the device 20 confirms the presence of the detected short-circuit.

In particular, during this sub-step 173, the control device 20 confirms the presence of the short-circuit when the temporal derivative $dI_c/dt$ of the main current $I_c$ remains greater than or equal to zero for an additional period according to the test period $T_t$. If not, the control device 20 deduces that a short-circuit has not occurred.

The additional period begins at the end of the test period $T_t$ and ends for example with the temporal observation window $T_{obs}$.

When a short-circuit has been detected, the control device 20 then signals the short-circuit and keeps the transistor 14 in the off state at least during a predetermined blocking period.

The test period $T_t$ is configurable by the control device 20 and adjustable prior to carrying out the method 100, for example between 1 µs and 10 µs.

The length of the observation window $T_{obs}$ is configurable by the control device 20 and adjustable prior to carrying out the method 100, for example between 1 µs and 20 µs.

The test period $T_t$ and the additional period are comprised in the observation window $T_{obs}$.

Figure 7:
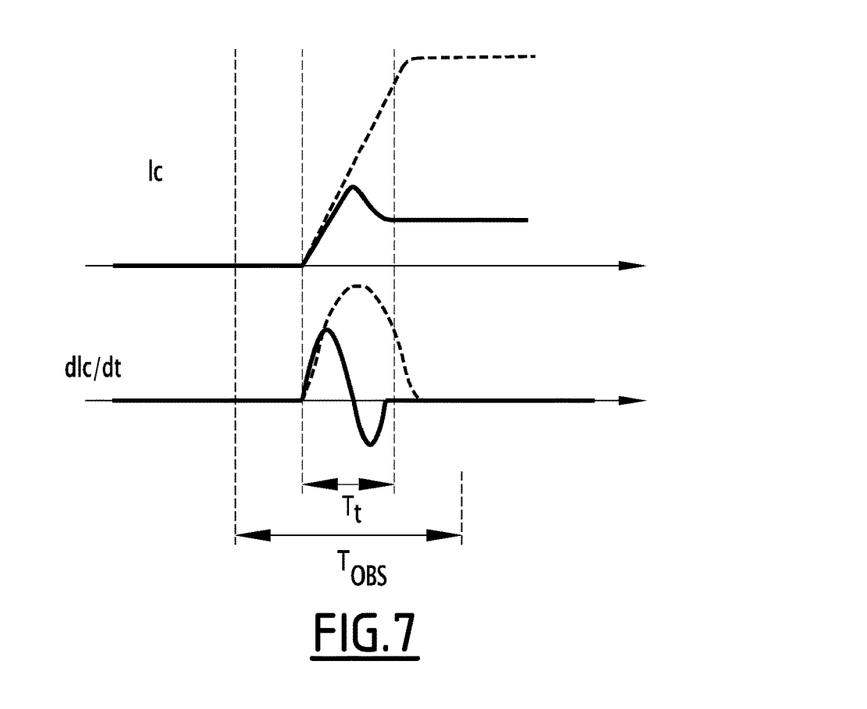
FIG. 7 is a schematic view illustrating the step for detecting a short-circuit of FIG. 6.

FIG. 7 illustrates the behavior of the main current $I_c$ and the temporal derivative $dI_c/dt$ of the main current $I_c$ in two examples of the implementation of the phase for switching to triggering.

In the first example corresponding to the solid lines of curves $I_c$ and $dI_c/dt$, no short-circuit has occurred. In this case, the sign of the derivative $dI_c/dt$ has changed during the test period $T_t$ and the control device 20 has therefore not detected any short-circuit.

In the second example corresponding to the broken lines of curves $I_c$ and $dI_c/dt$, a short-circuit has occurred. In this case, the sign of the derivative $dI_c/dt$ has been positive during the test period $T_t$ and equal to zero outside this period. The control device 20 has therefore detected a short-circuit.

One can see that the present invention has a certain number of advantages.

The control method according to the invention uses only measurements of the voltage $V_{GE}$ between the gate G and the emitter E and the sign of the derivative $dI_c/dt$ of the main current $I_c$ to control the different intermediate steps during switching of the transistor between the off state and the on state.

It should be noted that no measurement of the value of the main current $I_c$ or that of its derivative $dI_c/dt$ is necessary to carry out the method. Thus, only the sign of the derivative $dI_c/dt$ is important for controlling the transistor, which makes it possible to simplify the requirements for the various measuring means in the electrical network.

This then considerably simplifies the structure of the electrical circuit incorporating the transistor.

Furthermore, the sign of the derivative $dI_c/dt$ of the main current $I_c$ is used as adjusting means to limit the overvoltage when blocking the power component.

Thus, no inverter feedback circuit, and in particular, no circuit connected to the voltage across the terminals of the power component, is necessary to limit the overvoltage during blocking. This then constitutes a particular advantage of the invention.

The invention claimed is:

1. A control method for a transistor of the IGBT type, the transistor comprising a gate, a collector and an emitter, and defining an on state in which a main current flows between the collector and the emitter and an off state in which the collector is electrically isolated from the emitter;
the method including a phase for switching between the on state and the off state comprising generating a setpoint current, the intensity of which on the gate of the transistor assumes different setpoint values, at least some of the setpoint values being chosen as a function of the sign of the temporal derivative of the main current, each setpoint value being chosen from a set of predetermined setpoint values.

2. The method according to claim 1, wherein the switching phase further comprises measuring the voltage of the electrical current between the gate and the emitter and comparing this voltage with at least one predetermined voltage threshold.

3. The method according to claim 2, wherein at least one setpoint value is chosen when said voltage between the gate and the emitter reaches the predetermined voltage threshold.

4. The method according to claim 1, wherein at least one setpoint value is chosen as a function of the time elapsed from the moment when a previous setpoint value was chosen.

5. The method according to claim 1, wherein the switching phase is a phase for switching to triggering consisting of switching the transistor from the off state to the on state or a phase for switching to blocking consisting of switching the transistor from the on state to the off state.

6. The method according to claim 5, wherein the phase for switching to triggering comprises the following steps, carried out consecutively:
preliminary triggering step consisting of receiving an order to switch the transistor from the off state to the on state;
first switching step consisting of generating the setpoint current with an intensity equal to a first setpoint value until the voltage of the electrical current between the gate and the emitter reaches a predetermined triggering voltage threshold, or the temporal derivative of the main current becomes positive, or the time elapsed since the beginning of the first switching step reaches a first predetermined time threshold;
second switching step consisting of generating the setpoint current with an intensity equal to a second setpoint value until the temporal derivative of the main current becomes negative, or the time elapsed since the beginning of the second switching step reaches a second predetermined time threshold; and
third switching step consisting of generating the setpoint current with an intensity equal to a third setpoint value until the time elapsed since the beginning of the first switching step reaches a predetermined triggering time threshold.

7. The method according to claim 5, wherein the phase for switching to blocking comprises the following steps, carried out consecutively:
preliminary blocking step consisting of receiving an order to switch the transistor from the on state to the off state;
fourth switching step consisting of generating the setpoint current with an intensity equal to a fourth setpoint value until the voltage of the electrical current between the gate and the emitter reaches a predetermined blocking voltage threshold, or the temporal derivative of the main current becomes negative, or the time elapsed since the beginning of the fourth switching step reaches a fourth predetermined time threshold;
fifth switching step consisting of generating the setpoint current with an intensity equal to a fifth setpoint value until the time elapsed since the beginning of the fifth switching step reaches a fifth predetermined time threshold; and
sixth switching step consisting of generating the setpoint current with an intensity equal to a sixth setpoint value until the time elapsed since the beginning of the fourth switching step reaches a predetermined blocking time threshold.

8. The method according to claim 5, wherein the phase for switching to triggering further comprises a step for detecting a short-circuit comprising the detection of a short-circuit as a function of the sign of the temporal derivative of the main current in an observation time window having a predetermined length.

9. The method according to claim 5, wherein the method includes at least two phases for switching between the on state and the off state, which are the phase for switching to triggering and the phase for switching to blocking.

10. A control device for a transistor of the IGBT type, the transistor comprising a gate, a collector and an emitter, and defining an on state in which a main current flows between the collector and the emitter and an off state in which the collector is electrically isolated from the emitter;
the device being able to generate a setpoint current, the intensity of which on the gate of the transistor assumes different setpoint values, at least some of the setpoint values being chosen as a function of the sign of the temporal derivative of the main current, each setpoint value being chosen from a set of predetermined setpoint values.

* * * * *